United States Patent [19]
Hershey et al.

[11] Patent Number: 6,154,155
[45] Date of Patent: Nov. 28, 2000

[54] GENERAL FRAME-BASED COMPRESSION METHOD

[75] Inventors: John Erik Hershey, Ballston Lake; Namita Joshi, Schenectady; Mark Lewis Grabb, Burnt Hills; John Anderson Fergus Ross, Schenectady, all of N.Y.; Thomas Gerard Nowak, Langhorne, Pa.; Vincent Paul Staudinger, Niskayuna, N.Y.

[73] Assignee: General Electric Company, Schenectady, N.Y.

[21] Appl. No.: 09/263,579

[22] Filed: Mar. 8, 1999

[51] Int. Cl.$^7$ .................................................. H03M 7/40
[52] U.S. Cl. .............................. 341/65; 341/87; 348/390; 348/416
[58] Field of Search ................................. 341/65, 67, 87; 348/416, 397, 405; 358/146

[56] References Cited

U.S. PATENT DOCUMENTS

| | | | |
|---|---|---|---|
| 5,825,424 | 10/1998 | Canfield et al. | 348/416 |
| 5,844,608 | 12/1998 | Yu et al. | 348/390 |

OTHER PUBLICATIONS

"Satellite Data Archives Algorithm," K. Nickels; C. Thacker, IEEE, 1991, p. 447.

"Efficient Run–Length Encodings," H. Tanaka; A. Leon-Garcia, IEEE Transactions on Information Theory, vol. 28, 1982, pp. 880–890.

*Primary Examiner*—Brian Young
*Assistant Examiner*—John Nguyen
*Attorney, Agent, or Firm*—Marvin Snyder; Douglas E. Stoner

[57] ABSTRACT

A method of coding and compressing telemetry data makes use of the fact that the telemetry frames are typically highly correlated at a distance, $\delta$, corresponding to commutation or data periodicities. The existence of such periodicity is used to render a portion of each frame to zeros. The next steps are to search for and remove correlations between the bits in a set of frames, denoted $\{F_i^*\}$. The compression algorithm implementing the method according to the invention has four sub-steps; Data preconditioning, Compression and coding of first frame, $F_1$, Compression and coding of frames $2-\delta$, $F_1-F_\delta$, and Compression and coding of $F_{\delta+1}$ and on, the steady-state mode.

17 Claims, 6 Drawing Sheets

GENERAL FRAME-BASED COMPRESSION METHOD

BACKGROUND OF THE INVENTION

This invention relates to a method for coding and compressing frame-based data. The invention has particular application to the coding and compressing of telemetry data.

In satellite telemetry, it is important for the ground station operator to monitor and record the satellites' telemetry so that it can be later retrieved and analyzed. Although satellite telemetry is typically a very small portion of the data received from a satellite, over time the satellite telemetry may strain the storage facility provided for its retention. There is, therefore, a reason to compress the received satellite telemetry so that it can be stored in less space.

State-of-health telemetry compression methods have been reported (K. Nickels, C. Thacker, J. A. Storer and J. H. Reif, "Satellite data archives algorithm", Data Compression Conference, 1991, p. 447) that achieve ratios from 100:1 to 5000:1, but these methods are not lossless. In some applications, the compression must be lossless and the compression method must be of sufficiently low complexity to be able to run in near real-time.

BRIEF SUMMARY OF THE INVENTION

In an exemplary embodiment of the invention, the method makes use of the fact that the frames are typically highly correlated at a distance, δ, corresponding to commutation or data periodicities. The existence of such periodicity is used to render a very significant portion of each frame to zeros. The next steps are to search for and remove correlations between the bits in a set of frames, denoted $\{F_i^*\}$. The compression algorithm implemented method according to the invention has four phases:

i. Data preconditioning,
  ii. Compression and coding of first frame, $F_1$,
  iii. Compression and coding of frames 2–δ, $F_2$–$F_{δ,\ and}$
  iv. Compression and coding of $F_{δ+1}$ and on, the steady-state mode.

BRIEF DESCRIPTION OF THE DRAWINGS

The foregoing aspects and advantages will be better understood from the following detailed description of a preferred embodiment of the invention with reference to the drawings in which.

DETAILED DESCRIPTION OF THE INVENTION

Figure 1:
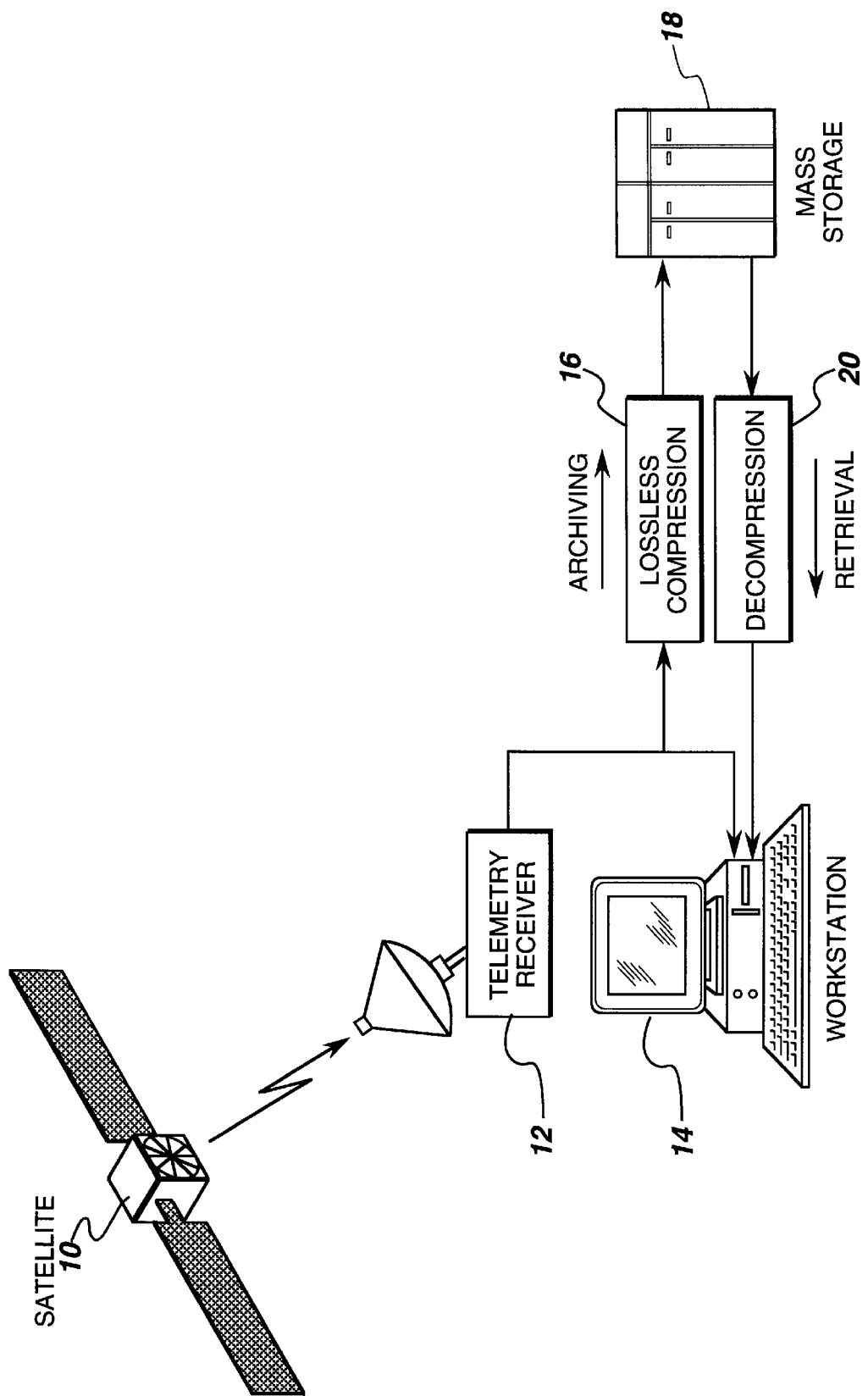
FIG. 1 is a block diagram illustrating telemetry archival and retrieval employing lossless near real-time compression according to the invention.

Referring to the drawings, and more particularly to FIG. 1, there is shown a block diagram of a satellite telemetry system which illustrates the concepts of lossless data compression pertaining to the present invention. Telemetry data from a satellite 10 is transmitted to a telemetry receiver 12 which provides output to a workstation 14. The received data is also compressed in lossless compressor 16. One embodiment of the invention includes mass storage 18, and the compressed data output of lossless compressor 16 is provided to mass storage 18 for storage. Mass storage 18 may be later accessed by workstation 14 to retrieve the compressed data. The retrieved data is decompressed by decompressor 20.

The telemetry of instant interest is frame based, i.e., a continuous series of delineated blocks of data of the same length. The bits in a particular frame correspond to binary values of samples of monitored variables. The samples are taken periodically and, knowing the frame number and the bit position within the frame, it is possible to reconstruct the value of the monitored variable.

Some variables are sampled at a lower rate than others. It is helpful to think of the process as a set of spinning commutators that are sampling the variables as shown in FIG. 2.

Figure 2:
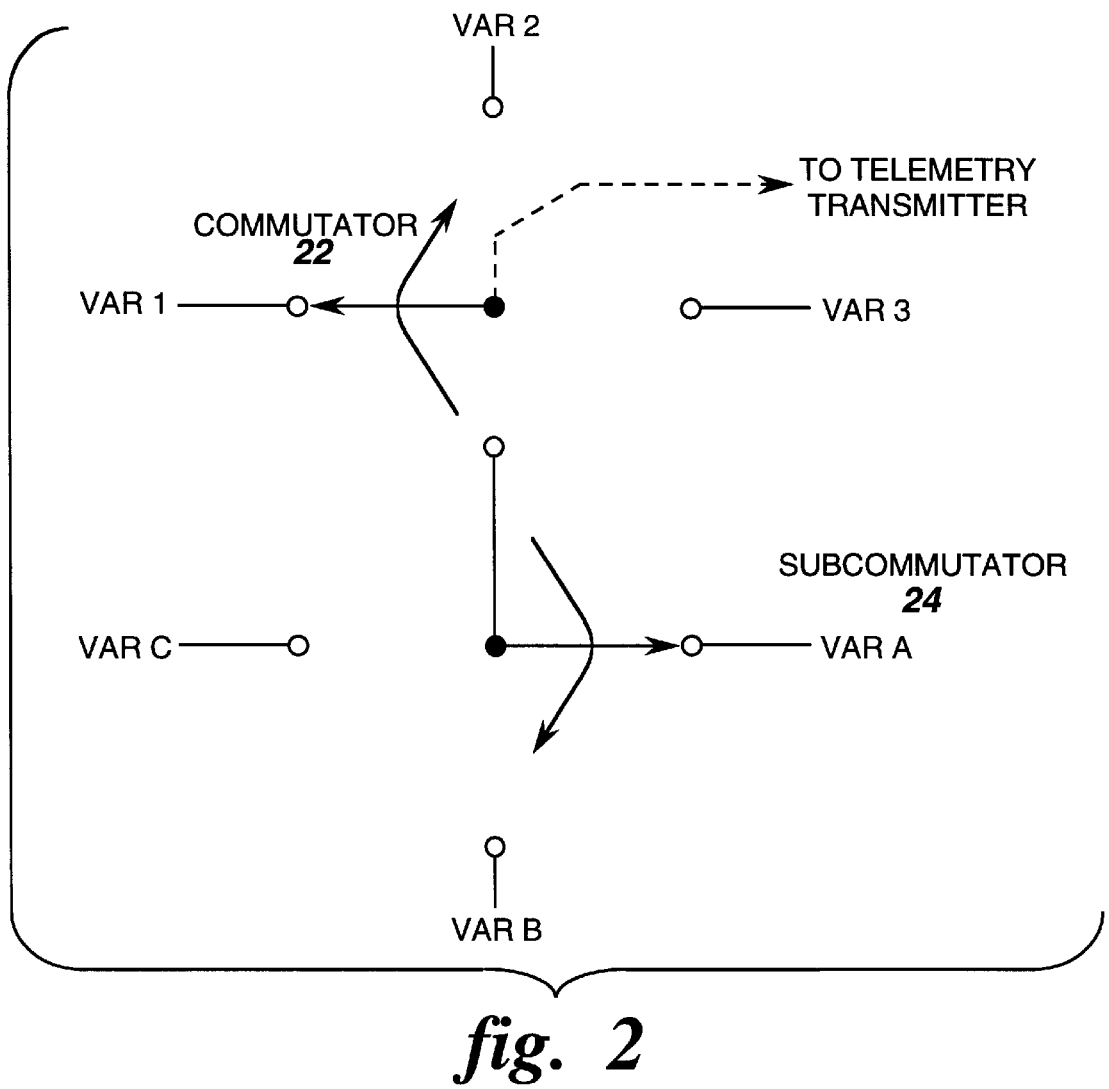
FIG. 2 is switching diagram illustrating the commutator analogy used to explain the sampling process.

In FIG. 2, the Commutator 22 samples four positions periodically and the Subcommutator 24 samples three positions periodically. Three of the four positions of Commutator 22 are always information about the same variables, i.e., Variable 1, Variable 2, and Variable 3. The fourth position, however, is information about one of the three positions of Subcommutator 24; i.e., Variable A, Variable B, or Variable C. The telemetry transmitter therefore transmits information respecting the variables in the following order 1,2,3,A,1,2, 3,B,1,2,3,C,1,2,3,A,1,2, . . . In the example sketched in FIG. 2, Variables 1, 2, and 3 are thus sampled three times as often as Variables A, B, and C. The data variables themselves may also exhibit periodicities.

Because telemetry data is usually highly oversampled, i.e., sampled much faster than it need be to accurately reconstruct the variables reported, there are likely to be significant autocorrelations at the sampling periods. The system and method of the invention exploit these autocorrelations for purposes of compression. The first step of one embodiment of the method of the invention is to find the distance, δ, between frames which yield the greatest autocorrelation in the frame sequence. For notation purposes, consider that the telemetry data consists of a set of frames, $\{F_i\}$, where each frame has B bits. In one embodiment, for example, B=4096. That is, each frame of telemetry data has 4096 bits. The $j^{th}$ bit in the $i^{th}$ frame is denoted as $F_i(j)$.

To determine δ, the autocorrelation is estimated for various autocorrelation lags. Typically, a number of consecutive frames is collected as a sample for study. For purposes of this specification, the autocorrelation for lag t is denoted by R(t) and defined as:

$$R(\tau) = \frac{\sum_{i=1}^{\text{Number of Frames in Sample}-\tau} [A(F_i, F_{i+\tau}) - D(F_i, F_{i+\tau})]}{B \cdot (\text{Number of Frames in Sample-}\tau)}. \quad (1)$$

wherein:

A(',') is the number of bits in Frame i that agree with the respective bits in Frame i+t, and D(',') is the number of bits in Frame i that disagree with the respective bits in Frame i+t.

Next, the value of t, t>1, for which R(t) is a maximum is calculated. This value is denoted by δ.

Figure 3:
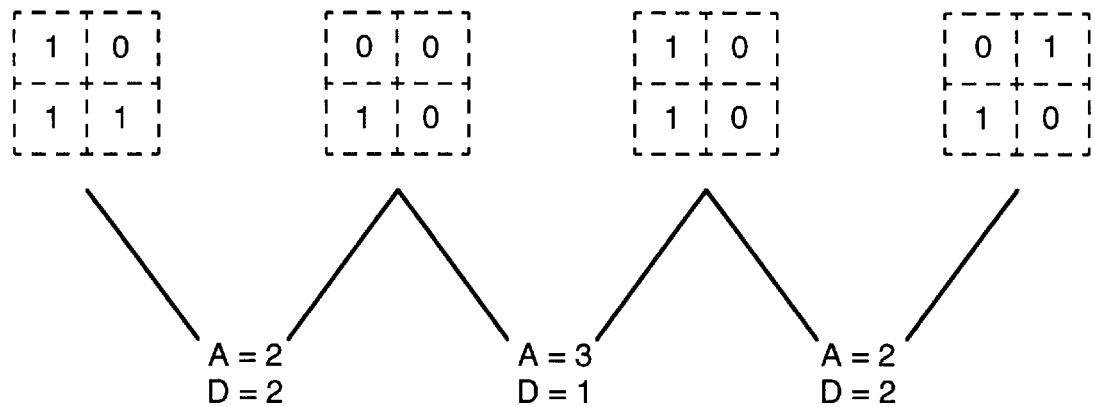
FIG. 3 is a diagram illustrating four consecutive sample telemetry frames illustrating how they are used to compute autocorrelation lag 1.

As a simple example of how to carry out the step of determining δ, according to one embodiment of the method of the invention, consider telemetry consisting of four bits per frame, i.e., B=4. Let us assume that we have four consecutive frames as our study sample. The four frames are shown in FIG. 3 along with the computation of A(1,2), D(1,2), A(2,3), D(2,3), and A(3,4), D(3,4). From this information the estimated lag 1 of the autocorrelation is:

$$R(1) = \frac{[2-2] + [3-1] + [2-2]}{4 \cdot 3} \quad (2)$$
$$= \frac{1}{6}.$$

Figure 4:
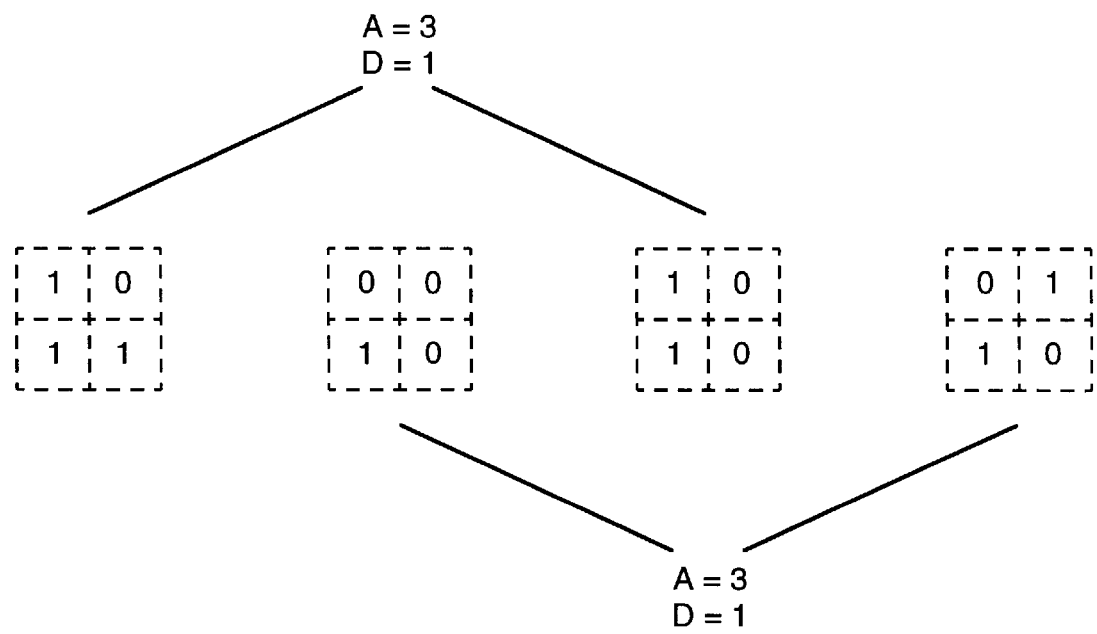
FIG. 4 is a diagram illustrating the same tour consecutive sample telemetry frames illustrating how they are used to compute autocorrelation lag 2.

FIG. 4 illustrates the development of the information necessary to compute the estimate of lag 2 of the autocorrelation which is $$R(2) = \frac{[3-1] + [3-1]}{4 \cdot 2} \quad (3)$$
$$= \frac{1}{2}.$$

Figure 5:
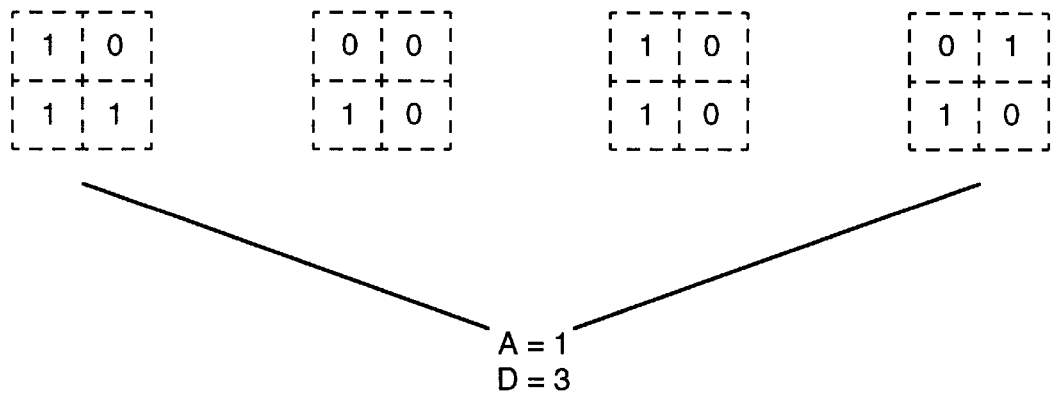
FIG. 5 is a diagram illustrating the same four consecutive sample telemetry frames illustrating how they are used to compute autocorrelation lag 3.

FIG. 5 illustrates the development of the information necessary to compute the estimate of lag 3 of the autocorrelation which is $$R(3) = \frac{[1-3]}{4 \cdot 1} \quad (4)$$
$$= -\frac{1}{2}.$$

From the above we see that R(2) is the maximum of the autocorrelation estimates, and thus we set δ=2.

The next steps of the method are to search for and remove correlations between the bits in the $\{F_i\}$. An algorithm to accomplish these steps, according to one embodiment of the invention, has four sub-steps steps:

i. Data preconditioning, ii. Compression and coding of first frame, $F_1$, iii. Compression and coding of frames 2–δ, $F_2$–$F_{\delta, \text{ and}}$ iv. Compression and coding of $F_{\delta+1}$ and on, the steady-state mode.

i. Data Preconditioning

The data preconditioning sub-step is accomplished by performing a bit-by-bit exclusive-ORing of the bits in frames spaced by δ. Thus, the sequence of frames $\{F_i\}$, is converted into a new sequence of frames, $\{F_i^*\}$, according to the rule $$F_i^* \begin{cases} F_i(j), & \forall\, j, i = 1, 2, \ldots, \delta \\ F_i(j) \oplus F_{i-\delta}(j), & \forall\, j, i > \delta \end{cases} \quad (5)$$

where the operator "⊕" denotes exclusive-OR, i.e., A$\overline{B}$+$\overline{A}$B or $$0 \oplus 0 = 0$$
$$0 \oplus 1 = 1$$
$$1 \oplus 0 = 1$$
$$1 \oplus 1 = 0 \quad (6)$$

Figure 6:
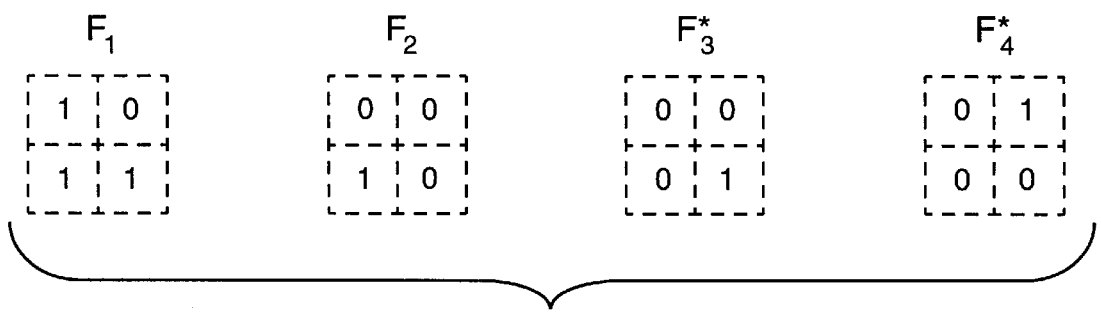
FIG. 6 is a diagram illustrating the result of data preconditioning of the four consecutive sample telemetry frames illustrated in FIGS. 3 to 5.

Applying this sub-step to the previous example wherein δ=2, $F_3$, $F_4$ is converted to $F_3^*$, $F_4^*$ as depicted in FIG. 6.

ii. Compression and Coding of the First Frame

There are many possible choices for carrying out this sub-step. One embodiment of the invention relies on variable-length coding, such as simple Huffman or Hankamer coding. Publicly available routines exist for carrying out this sub-step, such as gzip (a publicly available compression routine; see http://www.gzip.org).

iii. Compression and Coding of Frames 2–δ

In one embodiment of the invention, simple data preconditioning, such as forming $F_1$, $F_1 \oplus F_2$, $F_2 \oplus F_3$, ..., $F_{\delta-1}$ $F_\delta$ is performed, followed by compression of $F_1 \oplus F_2$, $F_1 \oplus F_2$, ..., $F_{\delta-1} \oplus F_\delta$ using simple Huffman or Hankamer coding or the use of publicly available routines such as gzip.

iv. Compression and Coding of Frame δ+1 and on (Steady-State)

This sub-step comprises the following steps:

Step 1. Preparation of a Table of Probabilities (TOP). The TOP is prepared based on typical telemetry traffic. The TOP is prepared using the empirically determined quantities $\{\hat{\rho}_j\}$, where $\hat{\rho}_j$ is the approximation of the probability that the $j^{th}$ bit in the $\{F_i^*\}$ is a one. It is computed by simply forming the ratio $$\hat{\rho} = \frac{\text{Number of ones in position } j \text{ in } \{F_i^*\}}{\text{Number of Frames in } \{F_i^*\}}. \quad (7)$$

Step 2. Preparation of a Folded Table of Probabilities (FTOP) from the TOP by replacing any $\hat{\rho}_j > 0.5$ by $1 - \hat{\rho}_j$. The $j^{th}$ bit is also inverted. A telemetry Bit Inversion Table (BIT) is created which keeps track of any such replacements and inversions. This is done so that, on any subsequent decompression, the algorithm will be able to provide the correct sense of any such bit.

Step 3. The FTOP is ordered, top to bottom, in non-increasing values of the $\{\hat{\rho}_j\}$. A Bit Selection Table (BST) is created to keep track of the permutation created by the FTOP ordering. The first entry in the BST will correspond to the largest value of the $\{\hat{\rho}_j\}$. The BST is preserved along with the BIT. It will be utilized in correctly ordering decompressed bits.

Step 4. Remove correlations in highly correlated bit streams. By the nature of its construction, the BST will cluster bit streams that have similar probabilities. It is expected that telemetry streams will be such that some of the bit streams in a cluster will be highly correlated in the following sense. Two bit streams, $F_i^*(k)$ and $F_i^*(k')$, are defined to be significantly correlated if the probability of the bit stream created by exclusive-ORing $F_i^*(k)$ and $F_i^*(k')$, $\rho_\Sigma$ is significantly less than both $\rho_k$ and $\rho_k'$, i.e., $$\rho_\Sigma \ll \min(\rho_k, \rho_k') \qquad (8)$$

In one embodiment of the invention, $\rho_\Sigma$ is less than both $\rho_k$ and $\rho_k'$ and less than probability 0.01.

If two bit streams are found to be highly correlated, one of the bit streams is replaced with the exclusive-OR of the two streams and the stream's probability is replaced with $\rho_\Sigma$. A Correlation Table (CT) is maintained to keep track of such replacements so that they may be undone at decompression.

Once the correlations have been removed per this step, the FTOP is reordered so that the top to bottom probabilities are again in non-increasing order. The BST is also appropriately adjusted.

Step 5. A variant of the Ohnishi et al. Truncated Run Length Coding technique is applied to the bits as they are specified, top to bottom, in the BST. See H. Tanaka and A. Leon-Garcia, "Efficient Run-Length Encodings," IEEE Transactions on Information Theory, Vol. 28, pp. 880–890, 1982. This particular coding/compression scheme operates by coding a variable number of bits into variable length code words. For the example described herein, the R-Table (Table 1) is employed, keyed by the specific $\{\hat{\rho}_j\}$ of the bits to be coded.

TABLE 1

The R-Table

| Range of $\hat{\rho}_j$ | R |
|---|---|
| 0.382–0.500 | 1 |
| 0.214–0.382 | 2 |
| 0.113–0.214 | 4 |
| 0.0584–0.113 | 8 |
| 0.0296–0.0584 | 16 |
| 0.0149–0.0296 | 32 |
| 0.00749–0.0149 | 64 |
| 0.00375–0.00749 | 128 |
| 0.00188–0.00375 | 256 |
| 0.000939–0.00188 | 512 |
| 0.000470–0.000939 | 1024 |
| 0.000235–0.000470 | 2048 |
| 0–0.000235 | 4096 |

The coding technique of step 5 proceeds as follows:

I. Start at the top of the FTOP and work down.

II. Find the R corresponding to the probability of the first uncoded bit. Construct the Run Length Substitution Code per Table 2.

III. For the case where R=I, the coding is the trivial case wherein the coded bit is simply the source bit. Return to STEP II.

IV. For the case where R>I, examine the R uncoded bits starting at the first uncoded bit. If the R bits are all zeros, then replace all of the R zeros with a single 0 as per Table 2.

i. If there is a run of K, $0 \leq K \leq R-2$, zeros, starting with the first uncoded bit, replace the K zeros and the one following the K zeros with the K+2 bit code word per Table 2.

ii. If there is a run of K=R−1 zeros, replace the K zeros and the one following the K zeros with R ones as per Table 2.

Return to STEP II.

TABLE 2

The Run Length Substitution Code

| Source Pattern | Code Word |
|---|---|
| 1 | 10 |
| 01 | 110 |
| 001 | 1110 |
| . | . |
| . | . |
| . | . |
| 000⋯1 | 1111⋯10 |
| 000⋯01 | 1111⋯11 |
| 000⋯00 | 0 |
| \|←R bits→\| | \|←R bits→\| |

There is one exception to the above procedure. The exception provides for the termination of the coding. If, after replacing a string of bits, there are no more bits in the frame, then the frame coding is completed. A counter which counts the number of bits coded may be used to keep track of the number of bits that have been encoded. Additionally, if there are fewer than R bits remaining and they are all zero, then the code word 0 should be used to replace the remaining bits. Finally, if the last bit in the frame being coded is a 1, then the algorithm is declared finished after the coding of that bit.

The following three tables provide examples of the coding Table 2, above.

TABLE 3

R = 1

| Uncoded Bits | Coded Bits | Remarks |
|---|---|---|
| 0 | 0 | "Trivial" Case |
| 1 | 1 | |

TABLE 4

R = 2

| Uncoded Bits | Coded Bits | Remarks |
|---|---|---|
| 00 | 0 | The small, highlighted, and italicized uncoded bits signify that they remain uncoded and still await coding after this step. |
| 01 | 11 | |
| 10 | 10 | |
| 11 | 10 | |

TABLE 5

R = 4

| Uncoded Bits | Coded Bits | Remarks |
|---|---|---|
| 0000 | 0 | The small, highlighted, and italicized uncoded bits signify that they remain uncoded and still await coding after this step. |
| 0001 | 1111 | |
| 0010 | 1110 | |
| 0011 | 1110 | |
| 0100 | 110 | |
| 0101 | 110 | |
| 0110 | 110 | |
| 1111 | 110 | |
| 1000 | 10 | |
| 1001 | 10 | |

TABLE 5-continued

R = 4

| Uncoded Bits | Coded Bits | Remarks |
|---|---|---|
| 1010 | 10 | |
| 1011 | 10 | |
| 1100 | 10 | |
| 1101 | 10 | |
| 1110 | 10 | |
| 1111 | 10 | |

Step 6. After the Ohnishi et al. Truncated Run Length Coding technique has been applied to a frame, the frame is encoded by the publicly available gzip routine, according to one embodiment of the invention. This step is performed for two reasons. The first is to try to achieve a bit more compression. The second is to attempt to achieve at least nominal compression for those instances where the statistics of the telemetry stream depart suddenly and significantly from the expected statistics.

As the telemetry bit streams will most likely not remain stationary over time, one embodiment of the invention includes a further step of repeating, or reinitializing, the steps of the method of the invention periodically. For example, in situations wherein the observed compression ratio drops significantly below its peak, the algorithm of one embodiment of the invention is a periodically reinitialized. Reinitialization will decrease the initial compression as it will require overhead storage, i.e., the tables of the algorithm, but this overhead will be increasingly amortized as the algorithm runs until its next reinitialization.

One embodiment of the invention comprises a particular partial implementation of the above. This particular partial implementation comprises the following sub-steps: (i) Data preconditioning as described, (ii) Compression and coding of first frame, $F_1$, as described, (iii) Compression and coding of frames 2–δ. $F_2$–$F_δ$, as described and (iv) Compression and coding of $F_{δ+1}$ and on, an alternative steady-state mode which consists solely of encoding the $\{F_i^*\}$ using a publicly available routine such as gzip.

Figure 7:
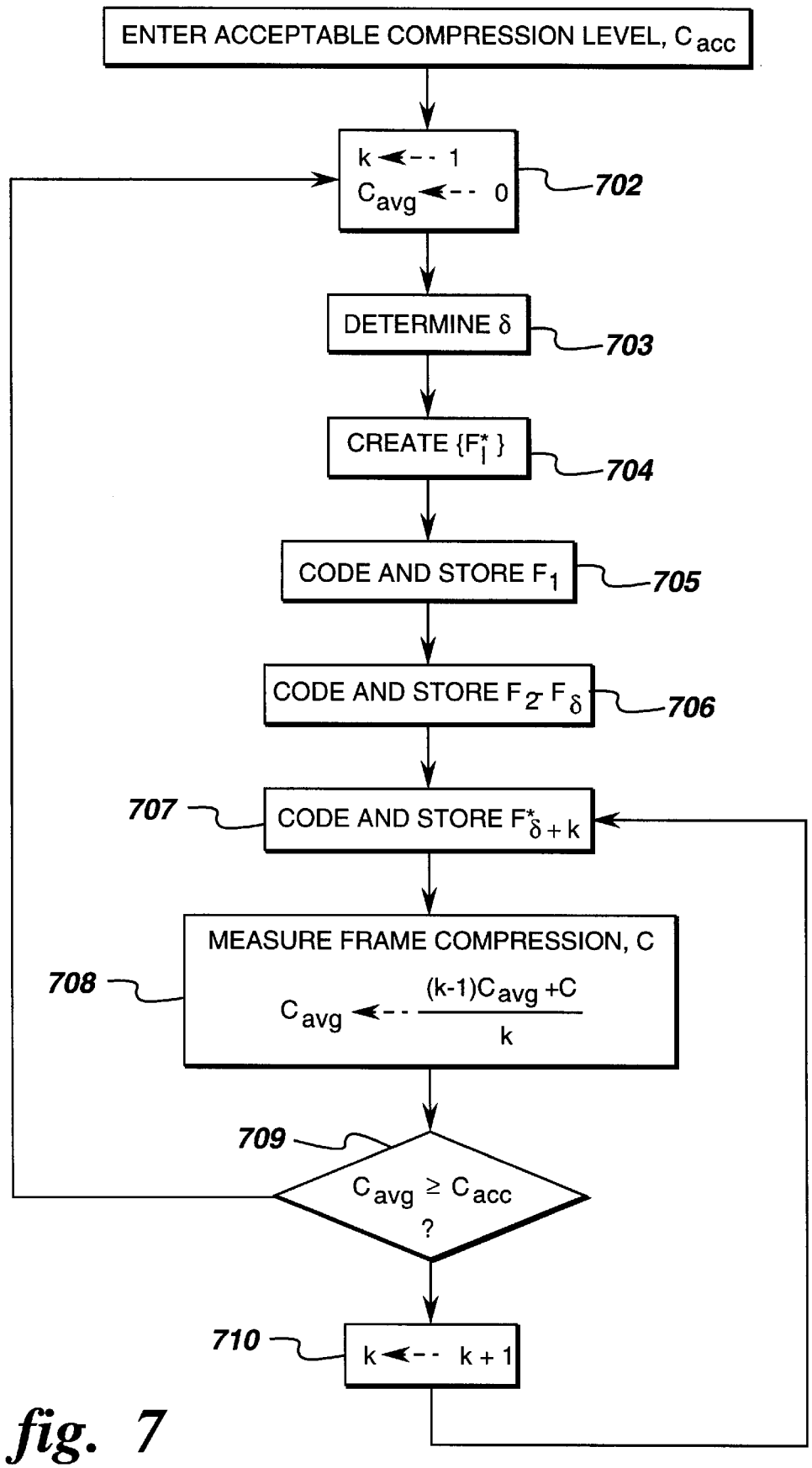
FIG. 7 is a flow diagram illustrating the logic of the four phases of the algorithm implemented according to the invention.

The process is illustrated in FIG. 7. The input at 701 is the acceptable compression level, $C_{acc}$. On entering the processing loop, k is set to 1, and $C_{avg}$ is set to 0, both in function block 702. The first step of the processing loop is to determine δ in function block 703. Equation (1) is used to make this determination. The process is illustrated by the simple example in FIGS. 3, 4 and 5 and equations (2), (3) and (4). The next steps are to search for and remove correlations between the bits in the $\{F_i\}$. As described above, there are four sub-steps to this algorithm. First, the set of frames $\{F_i^*\}$ is created in function block 704. Next, frame $F_1$ is coded and stored in function block 705. This is followed by coding and storing frames $F_2$–$F_δ$ in function block 706. Finally, $F_{δ+k}$ is coded and stored in function block 707. Then, in function block 708 the frame compression, C, is measured as $$C_{avg} \leftarrow \frac{(k-1)C_{avg} + C}{k}.$$

Figure 8:
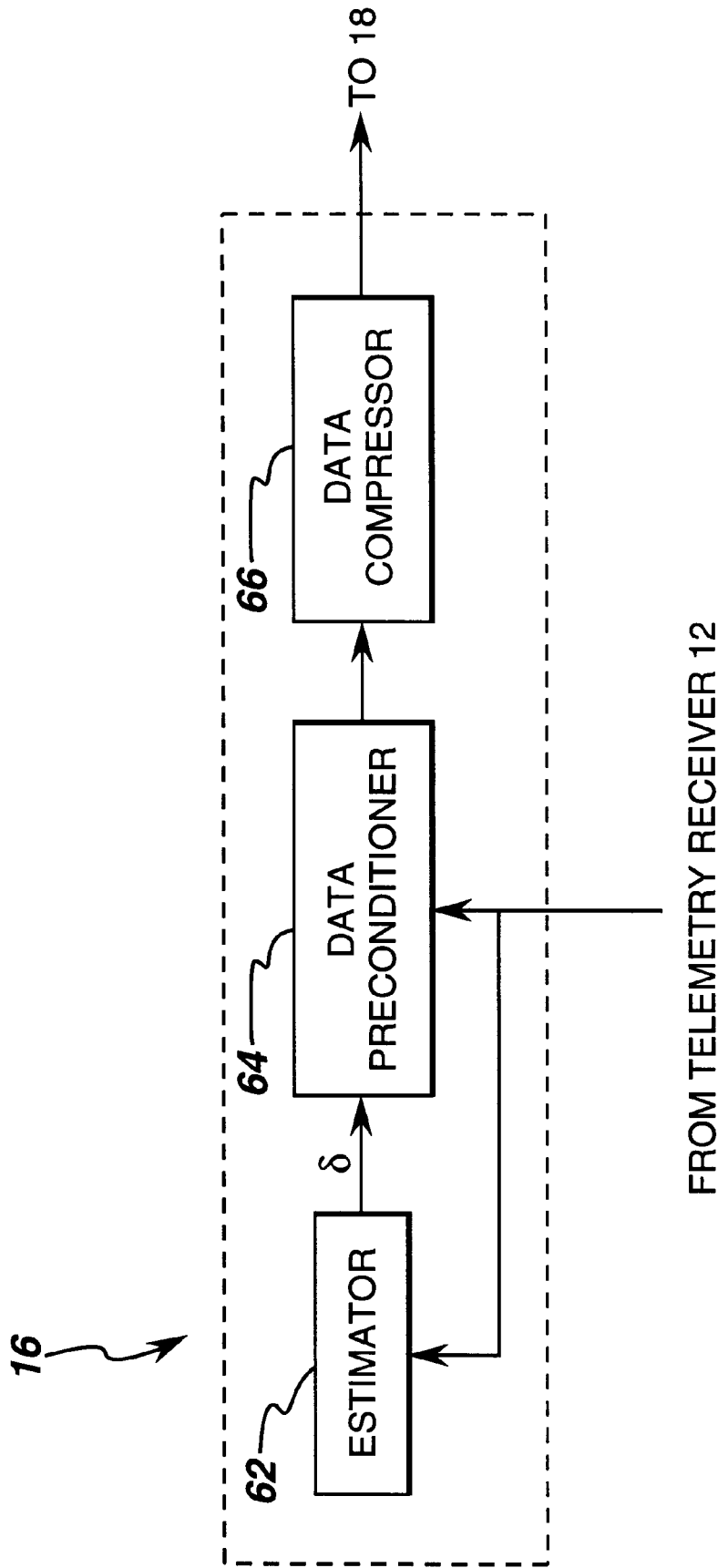
FIG. 8 is a block diagram of the lossless compression block of the block diagram of FIG. 1.

A test is made in decision block 709 to determine if $C_{avg} \geq C_{acc}$. If not, the process loops back to function block 702; otherwise, k is set to k+1 in function block 710, and the process loops back to function block 707, the steady-state condition. A system for carrying out the method of the invention includes a lossless compressor 16. Lossless compressor 16 comprises estimator 62, data preconditioner 64 and data compressor 66 as illustrated in FIG. 8.

While the invention has been described in terms of a single preferred embodiment and a particular modification, those skilled in the art will recognize that the invention can be practiced with modification within the spirit and scope of the appended claims.

What is claimed is:

1. A method of coding and compressing frame-based data comprising the steps of:

estimating autocorrelations for various lags of consecutive frames of said frame based data;

selecting a lag, δ, corresponding to a maximum of the estimated autocorrelations; and removing correlations between bits in selected frames of said frame based data, based on said selected lag δ.

2. The method of claim 1 wherein the step of removing correlations between bits in selected frames of said frame based data comprises the steps of:

preconditioning said data by performing a bit-by-bit exclusive-ORing of bits in frames spaced by the selected lag;

compressing and coding a first frame of said consecutive frames of data;

compressing and coding frames 2 to δ; and compressing and coding frames δ+1 and on.

3. The method of coding and compressing frame-based data as recited in claim 2 wherein the step of compressing and coding frames δ+1 and on uses a table of probabilities prepared based on frame-based data traffic.

4. The method of coding and compressing frame-based data as recited in claim 1 wherein said frame-based data is satellite telemetry data and further comprising the step of storing the compressed data for later retrieval and analysis.

5. The method of coding and compressing frame-based data as recited in claim 2 wherein the step of preconditioning data is performed by a bit-by-bit exclusive-ORing of the bits in frames spaced by δ to convert a sequence of frames $\{F_i\}$, into a new sequence of frames, $\{F_i^*\}$, according to the rule $$F_i^* \begin{cases} F_i(j), & \forall j, i = 1, 2, \ldots, \delta \\ F_i(j) \oplus F_{i-\delta}(j), & \forall j, i > \delta \end{cases}$$

where the operator "⊕" denotes exclusive-OR.

6. The method of coding and compressing frame-based data as recited in claim 5 wherein the step of compressing and coding the first frame of the frame-based data is performed using variable-length coding.

7. The method of coding and compressing frame-based data as recited in claim 5 wherein the steps of compressing and coding the first frame of the frame-based data and compressing and coding frames 2 to δ are performed using variable-length coding.

8. The method of coding and compressing frame-based data as recited in claim 7 wherein the variable-length coding is Huffman coding.

9. The method of coding and compressing frame-based data as recited in claim 7 wherein the variable-length coding is Hankamer coding.

10. The method of coding and compressing frame-based data as recited in claim 7 further comprising the step of preconditioning data using an exclusive-ORing function prior to compression and coding of frames 2–δ.

11. The method of coding and compressing frame-based data as recited in claim 7 wherein the step of compressing and coding frames δ+1 and on uses a table of probabilities prepared based on frame-based data traffic.

12. The method of coding and compressing frame-based data as recited in claim 11 wherein the frame-based data is satellite telemetry data and further comprising the step of storing the compressed data for later retrieval and analysis.

13. The method of coding and compressing frame-based data as recited in claim 15 further comprising the step of preconditioning data using an exclusive-ORing function prior to compression and coding of frames 2–δ.

14. The method of coding and compressing frame-based data as recited in claim 15 wherein the step of compressing and coding frames δ+1 and on uses a table of probabilities prepared based on frame-based data traffic.

15. A system for coding and compressing frame-based comprising:
   an estimator for estimating autocorrelations for various lags of consecutive frames and for selecting a lag, δ, corresponding to a maximum of the estimated autocorrelations;
   a data preconditioner for preconditioning data performing a bit-by-bit exclusive-ORing of bits in frames spaced by the selected lag;
   a compressor for compressing and coding frames of the frame-based data based on said selected lag.

16. The system of claim 15 wherein said compressor is configured to first compress and code frames 2 to δ; then to compress and code frames δ+1 and on.

17. The system as recited in claim 15 wherein the frame-based data is satellite telemetry data and further comprising means for storing the compressed data for later retrieval and analysis.

* * * * *